US006988043B1

(12) United States Patent
Randall (10) Patent No.: US 6,988,043 B1
(45) Date of Patent: Jan. 17, 2006

(54) EXTERNAL TRANSFORMER CORRECTION IN AN ELECTRICITY METER

(75) Inventor: Bruce E. Randall, Rock Hill, SC (US)

(73) Assignee: Landis+Gyr Inc., Lafayette, IN (US)

( * ) Notice: Subject to any disclaimer, the term of this patent is extended or adjusted under 35 U.S.C. 154(b) by 0 days.

(21) Appl. No.: 09/693,025

(22) Filed: Oct. 20, 2000

Related U.S. Application Data (60) Provisional application No. 60/160,675, filed on Oct. 21, 1999.

(51) Int. Cl.
*G01R 21/00* (2006.01)
(52) U.S. Cl. .......................... 702/61; 702/60; 702/62; 702/65; 340/870.04
(58) Field of Classification Search ................. 324/74, 324/141, 142, 86; 340/870.01, 870.02, 870.04; 702/60, 61, 62, 65
See application file for complete search history.

(56) References Cited

U.S. PATENT DOCUMENTS 5,544,089 A   8/1996  Hemminger et al.
5,933,004 A   8/1999  Jackson et al.
6,112,158 A   8/2000  Bond et al.

OTHER PUBLICATIONS

Horowitz and Hill, "The Art of Electronics", Cambridge University Press, 1989, pp. 636-638.*

* cited by examiner

*Primary Examiner*—Michael Nghiem
*Assistant Examiner*—Stephen J. Cherry
(74) *Attorney, Agent, or Firm*—Maginot, Moore & Beck (57) ABSTRACT

A method compensates for measurement errors of an external transformer coupled between an electricity meter and one or more power lines. The method includes a first step of obtaining at least one error rating for the external transformer. The method also includes the step of storing data representative of the at least one error rating in a memory within the meter. At some point the electricity meter is coupled to the external transformer. The method further includes the step of employing the meter to obtain at least one electricity consumption measurement value, the at least one electricity consumption value including either a sampled current value or a sampled voltage value. Finally, the method includes the step of causing the meter to adjust the at least one electricity consumption measurement value using at least a portion of the stored data.

23 Claims, 6 Drawing Sheets

EXTERNAL TRANSFORMER CORRECTION IN AN ELECTRICITY METER

This application claims the benefit of U.S. Provisional Patent Application No. 60/160,675, filed Oct. 21, 1999.

FIELD OF THE INVENTION

The present invention relates generally to electricity meters, and in particular, to electricity meters that are coupled to a system to be measured via external transformers.

BACKGROUND OF THE INVENTION

Electricity meters are devices that, among other things, measure the consumption of electricity by a residence, factory, commercial establishment or other such facility. Electricity meters may also be employed to measure electricity flow between different electrical power generation or delivery systems. Electrical utility service providers employ electricity meters to track customer usage of electrical power or energy. Utilities track customer usage for many purposes, including billing and tracking demand.

At present electricity meters often include digital circuitry that performs many of the energy-related calculations. Examples of such meters are shown and discussed in U.S. Pat. No. 5,544,089, U.S. Pat. No. 5,933,004, and U.S. Pat. No. 6,112,158, which are incorporated herein by reference. Such meters, referred to generally herein as electronic meters, typically include analog sensor circuitry and digital measurement circuitry.

The analog sensor circuitry includes one or more sensor devices that sense or detect current and/or voltage levels on the power lines of the system being measured. The sensor devices generate analog measurement signals that are representative of the detected current and voltage waveforms actually present on the power lines. The analog sensor circuitry typically provides the signals to analog to digital conversion circuitry which generates digital versions of the measurement signals.

In an electronic meter, the measurement circuit typically performs energy-related calculations on the digitized measurement signals. In general, the measurement circuit will perform, among other things, an energy or watt-hour calculation.

To this end, measurement circuit multiplies the digitized voltage measurement signal by the digitized current measurement signal. In particular, the digitized measurement signals consist of sampled voltage measurement values and sampled current measurement values. By multiplying the individual voltage samples by the individual current samples and summing the resulting products over time, energy consumption values are obtained. In particular, in a single phase system, the energy consumption measurement may be given by the following equation:

$$WH = \Sigma V(n)*I(n)*T_n; \text{ for } n=1 \text{ to } N,$$

Where WH is equal to energy consumption (e.g. watt-hours), $T_n$ is the sample period of n, V(n) is the nth voltage sample, and I(n) is the nth current sample that is sampled contemporaneously with V(n). Where WH is equal to energy consumption (e.g. watt-hours), V(n) is the nth voltage sample, and I(n) is the nth current sample that is sampled contemporaneously with V(n).

The measurement circuit thereafter typically displays or communicates the calculated watt-hour data to a centralized computer or the like. The measurement circuit may also perform intermediate calculations to convert the WH data into units of measurement typically used in the metering industry. The measurement circuit may further perform various data tracking operations and/or control relays or other external devices responsive to the measured data. It is noted that the measurement circuit may calculate other energy consumption measurement values, such as RMS current, RMS voltage, reactive energy, apparent energy, or various power values. Such measurement values, as well as other energy or power related values generated from the measurement signals, are referred to generically herein as energy consumption data.

One important element of electricity meters, including electronic meters, is metering accuracy. Metering accuracy is important because inaccurate metering can result in substantial amounts of lost revenue. Moreover, inaccurate metering can also undesirably result in overcharging of customers.

The common sources of metering inaccuracies, or error sources in a meter, include the sensor devices in the sensor circuitry. In particular, sensor devices can produce error in both the magnitude of the measurement signals and the phase of the measurement signal waveform. For example, current transformers, which generate current measurement signals, often introduce significant magnitude and phase error into the current measurement signal. Such errors propagate through to the calculated energy consumption data.

To reduce the errors due to the sensor devices, electronic meters are typically calibrated. In particular, it is known to introduce a calibration factor into the energy calculation to compensate for current transformer error. The calibration factor is typically determined by subjecting the meter to a calibration procedure in the factory. The calibration procedure involves attaching the meter to measure a known amount of energy. The calibration factor is derived from the difference in the known amount of energy delivered and the amount of energy actually registered by the meter.

While such calibration procedures may reduce the inaccuracy due to error sources within the meter, factory calibration procedures are inadequate for addressing error sources external to the meter. One external error source is an instrument transformer. An instrument transformer is a transformer that is connected between the meter and the power lines. Instrument transformers are used to scale down the voltage and/or current that is actually delivered to and measured by the meter. Instrument transformers are uncommon in single residence applications, but are relatively common in larger, higher voltage and current systems, such as those used for large industrial or commercial establishments.

Instrument transformers, like the current transformers within the meter, often exhibit notable phase error and magnitude or ratio error. Indeed, it is common in the instrument transformer industry to provide a visual indication of the phase error and ratio error data on the instrument transformer itself. Such data are referred to as error ratings, including phase error ratings and ratio error ratings.

Because instrument transformers are external to the meter, factory calibration of the meter to compensate for the instrument transformer ratio and phase error is impracticable. In particular, instrument transformers are often installed independently of the meter, and indeed may be supplied from a different supplier than the electricity meter supplier. Thus, current calibration procedures cannot be used to calibrate the meter for the error caused by the external instrument transformers.

Errors due to instrument transformers are not insignificant. Accordingly, inaccurate metering and billing due to ratio and/or phase errors in instrument transformers can cost utilities and customers significant amounts of money. As a result, there is a need for some method (and apparatus) that corrects or compensates for errors caused by instrument transformers, or any transformer located external to the meter, to ensure relatively accurate metering.

SUMMARY OF THE INVENTION

The present invention fulfills the above need, as well as others, by providing a meter that stores information representative of error ratings of an external transformer, and then adjusts energy consumption values based at least in part on the stored information. Because the energy consumption values are adjusted based on the stored information representative of the error ratings of an external transformer, the meter can adjust the its energy consumption calculations to compensate for errors caused by the external transformer.

An exemplary method according to the present invention compensates for measurement errors of an external transformer coupled between an electricity meter and one or more power lines. The method includes a first step of obtaining at least one error rating for the external transformer. The method also includes the step of storing data representative of the at least one error rating in a memory within the meter. At some point the electricity meter is coupled to the external transformer. The method further includes the step of employing the meter to obtain at least one electricity consumption measurement value, the at least one electricity consumption value comprising either a sampled current value or a sampled voltage value. Finally, the method includes the step of causing the meter to adjust the at least one electricity consumption measurement value using at least a portion of the stored data.

An exemplary apparatus embodiment according to the present invention is an apparatus for use in an electricity meter that is operably coupled through an external transformer to measure electricity consumption on a power line. The apparatus is operable to compensate for measurement errors of an external transformer, and includes a memory and a processing circuit. The memory stores data representative of at least one error rating for the external transformer. The processing circuit is operable to obtain at least one electricity consumption measurement value, the at least one electricity consumption measurement value comprising either a sampled current value or a sampled voltage value. The processing circuit is further operable to adjust at least one electricity consumption measurement value using at least a portion of the stored data.

Accordingly, the above described method and apparatus compensate for external transformer error by adjusting energy consumption measurement values based at least one of the external transformer's error ratings. Moreover, as will be discussed further below, because the above embodiment of the present invention adjusts the actual voltage and/or current sample values, the compensation will propagate through to all energy consumption calculations that use the voltage and/or current values. By contrast, systems that adjust the watt-hour calculations alone may still use the erroneous raw data for other types of calculations within the meter.

Another exemplary method according to the present invention compensates for measurement errors of an external transformer coupled between an electricity meter and a power line, the electricity meter operable to measure electricity consumption on the power line. The method includes the steps of obtaining at least one error rating for the external transformer and storing data representative of the at least one error rating in a memory within the meter. At some point the electricity meter is coupled to the external transformer. The method further includes the steps of employing the meter to obtain at least one electricity consumption measurement value, and causing the meter to multiply either the at least one electricity consumption measurement value or a phase shifted electricity consumption measurement value by a dynamic compensation factor.

The above described method provides an advantage in that the amount of the adjustment is dynamic, and changes as the level of power consumed changes. As a result, the meter can compensate for an error of the transformer that varies as a function of the power (or current) through the transformer. This advantage can increase metering accuracy, regardless of whether the compensation is applied to the voltage and/or current samples or the final energy consumption calculations.

It is moreover preferable to decrease the adjustment factor as the power consumption level increases. To this end, the adjustment may involve the use of a correction factor that has an inverse relationship to an average level of current measured on the power lines. Such an adjustment approximates the error response curve of external instrument transformers.

The above described features and advantages, as well as others, will become more readily apparent to those of ordinary skill in the art by reference to the following detailed description and accompanying drawings.

DETAILED DESCRIPTION

Figure 1:
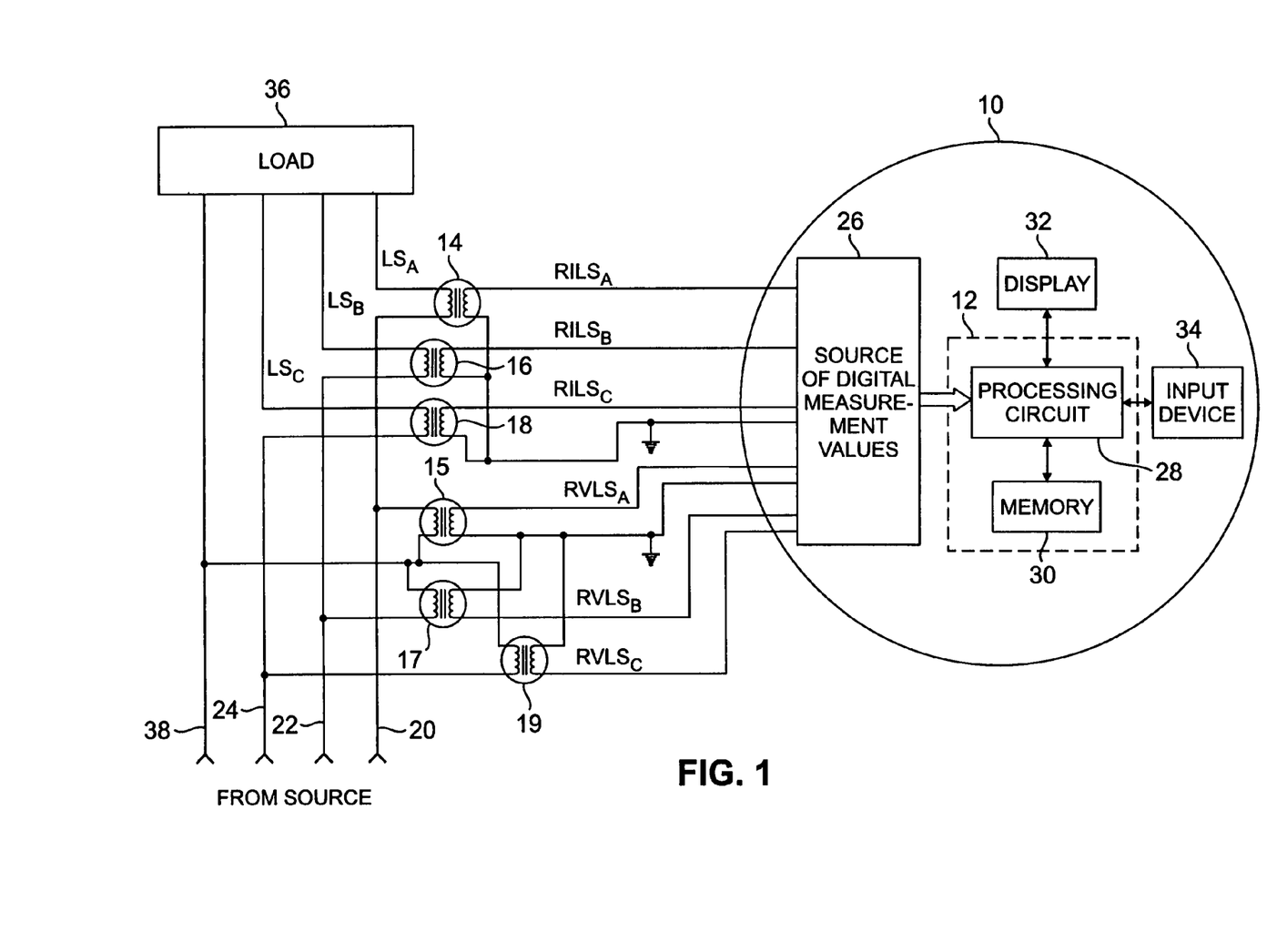
FIG. 1 shows a schematic block diagram of an exemplary electricity meter that incorporates a compensation apparatus according to the present invention installed to measure a three phase power system.

FIG. 1 shows a schematic block diagram of an exemplary electricity meter 10 that incorporates a compensation apparatus 12 according to the present invention. The electricity meter 10 is shown in context installed in a three phase power system. The exemplary embodiment of the compensation apparatus 12 described herein compensates for measurement errors caused by three external current transformers ("CTs") 14, 16, and 18, and three external potential transformers ("PTs") 15, 17 and 19. The CTs 14, 16 and 18 and the PTs 15, 17 and 19, respectively cooperate to couple the electricity meter 10 to the three phase power lines 20, 22, and 24, respectively.

While the electricity meter 10 in FIG. 1 is configured to measure a three phase, four wire wye service connection as is known in the art, it is be appreciated that those of ordinary skill in the art may readily modify the arrangement of FIG. 1 to accommodate a three wire delta, four wire delta, or other standard service connection types. The electricity meter 10 and the compensation apparatus 12 may also be readily modified for use in single phase service connections.

The meter 10 includes a source of digital energy consumption signals 26, a processing circuit 28, a memory 30, a display 32 and an input device 34. The meter 10 may of course include additional elements as a matter of design choice. For example, the meter 10 may include one or more external communication circuits. Likewise, the meter need not include a display 32 or an input device 34, depending on the embodiment employed.

In general, the compensation apparatus 12 includes at least a portion of the functionality of the processing circuit 28 and the memory 30. However, as is known in the art, the processing circuit 28 and the memory 30 can be configured to carry out several functions within the electricity meter 10, in addition to those attributable to the compensation apparatus 12 as described herein. Indeed, in the exemplary embodiment described herein, the processing circuit 28 further constitutes the main measurement circuit of the meter 10 in addition to its operations as part of the compensation apparatus 12.

In general, the power lines 20, 22, and 24 and a neutral line 38 are operably coupled to provide three-phase power to from a utility service provider, not shown, to a load 36. The CTs 14, 16 and 18 are current instrument transformers that deliver reduced current signals from power lines to an electricity meter. Such devices are well known in the art. Likewise, the PTs 15, 17 and 19 are potential instrument transformers that deliver reduced voltage signals from the power lines to an electricity meter. Such devices are also well known.

As shown in FIG. 1, the first external CT 14 and the first external PT 15 are coupled to the phase a power line 20. The first external CT 14 is configured to provide a reduced phase A power line current signal, $RILS_A$, which is representative of the current waveform on the phase A power line, to the source of digital energy consumption signals 26. The first external PT 15 is configured to provide a reduced phase A power line voltage signal, $RVLS_A$, which is representative of the voltage waveform on the phase A power line, to the source of digital energy consumption signals 26. In general, the first external CT 14 and the first external PT 15 introduce phase error and ratio error into the reduced phase A power line signals during the conversion. As is known in the art, the error ratings for the CT 14 and the PT 15 may be provided through indicia printed thereon.

Similarly, the second external CT 16 is configured to provide a reduced phase B power line current signal, $RILS_B$, which is representative of the current waveform on the phase B power line 22, to the source of digital energy consumption signals 26. The second external PT 17 is configured to provide a reduced phase B power line voltage signal, $RVLS_B$, which is representative of the voltage waveform on the phase B power line 22, to the source of digital energy consumption signals 26. As with the first external CT 14 and the first external PT 15, the second external CT 16 and the second external PT 17 introduce phase error and ratio error into the reduced phase B power line signals during the conversion. The phase error and the ratio error introduced by the first external CT 14 and the second external CT 16 need not be identical. Likewise, the phase error and the ratio error introduced by the first external PT 15 and the second external CT 17 need not be identical.

Additionally, the third external CT 18 and the third external PT 19 are operable to provide reduced phase C power line signals, $RILS_C$ and $RVLS_C$, to the source of digital energy consumption signals 26. The third external CT 18 and the third external PT 19 introduce their own phase error and ratio error into the reduced phase C power line signals.

The source of digital energy consumption signals 26 is a device that receives power line signals and generates digital energy consumption signals therefrom. Digital energy consumption signals may suitably include digital voltage signals and digital current signals. Digital voltage signals comprise a series of voltage samples that are representative of the voltage waveform for each reduced power line voltage signal. Similarly, digital current signals comprise a series of current samples that are representative of the current waveform for each reduced power line current signal.

Figure 2:
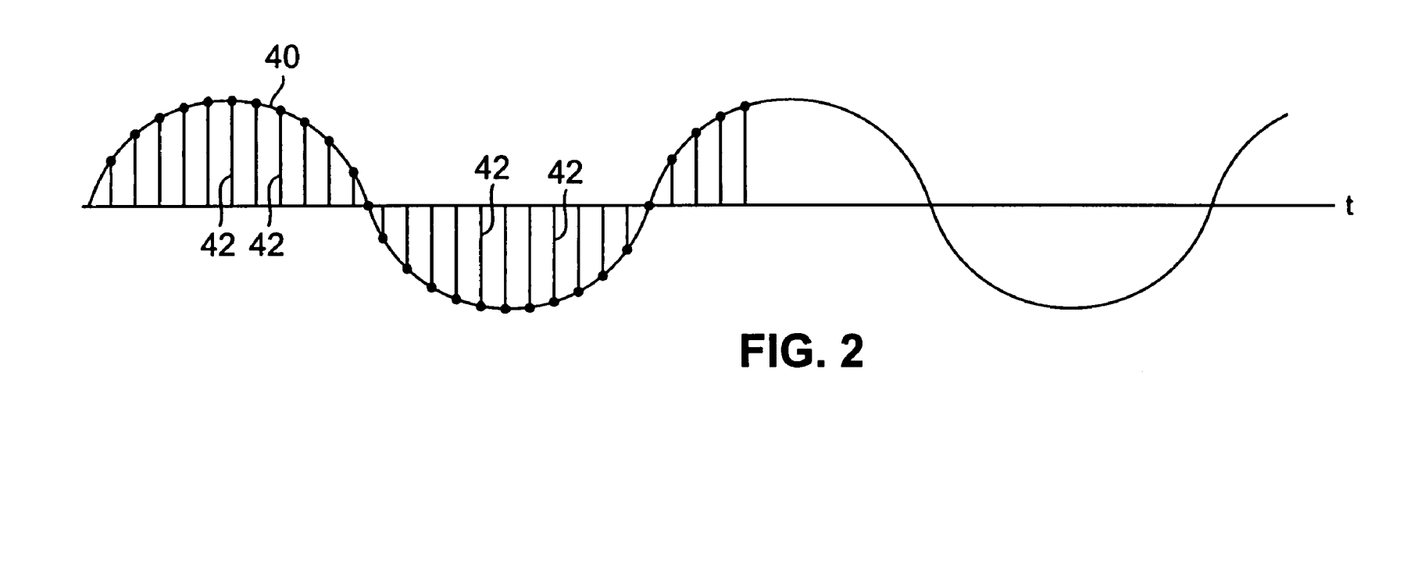
FIG. 2 shows an exemplary diagram of a reduced power line voltage waveform over time.

For example, with reference to FIG. 2, there is shown an exemplary diagram of a reduced power line voltage waveform 40 over time. The digital voltage signals are the series of samples indicated by the bars 42. The length of the each bar 42 represents the magnitude of the voltage waveform 40 at an instant in time. Digitally, the vertical height of each bar is represented as a digital voltage sample value.

In any event, the conversion of either reduced power line signals or non-reduced power line signals into such digital energy consumption signals is well-known and may be carried out in a variety of ways. Typically, in a multiphase system such as the one illustrated in FIG. 1, one or more digital energy consumption signals will be produced for each phase of the system. Thus, for example, the source of digital energy consumption signals 26 may produce a digital voltage signal for phase A, a digital current signal for phase A, a digital voltage signal voltage signal for phase B, a digital current signal for phase B, and so forth.

To generate the digital signals from the reduced power line signals, the source of digital energy consumption signals 26 may suitably include one or more sensor circuits, not shown, and one or more analog-to-digital conversion devices. The sensor circuits, as discussed further above in the background section, may be one or more devices that convert the incoming power line signals to voltage and current measurement signals. The A/D conversion devices convert the voltage and current measurement signals into digital voltage signals and digital current signals, respectively. Suitable sensor circuits and A/D conversion devices are well known. Exemplary sensor circuits and A/D conversion devices are shown in U.S. Pat. No. 5,544,089 and U.S. Pat. No. 6,112,158. In the embodiment described herein, a digital voltage signal and a digital current signal is produced for each phase of the three-phase power lines 20, 22 and 24.

The source of digital energy consumption signals 26 is operably connected to provide the digital energy consumption signals to the processing circuit 28. The processing circuit 28 is generally operable to generate energy consumption data (e.g. values representative of energy consumed, a current power consumption level, and/or average voltage or current levels). The processing circuit 28 is further operable to provide at least some of the energy consumption data to the display 32, where the data may be reviewed for billing and/or tracking purposes by utility personnel.

In accordance with the present invention, the processing circuit 28 further cooperates with the memory 30 to operate as the compensation apparatus 12 that performs an adjustment based on error ratings of the transformers 14, 15, 16, 17, 18 and 19. To this end, the memory 30 stores data representative of a ratio error rating and a phase error rating for each of the external transformers 14, 15, 16, 17, 18 and 19. The processing circuit 28 is configured to obtain at least one energy consumption measurement value and adjust the at least one electricity consumption measurement value using at least a portion of the stored error rating data.

For example, the processing circuit 28 may obtain an energy consumption measurement value in the form of the generated energy consumption data, such as a watt-hour value. As discussed above, the processing circuit 28 itself generates such energy consumption data from the received digital energy consumption signals. Once the processing circuit 28 generates the energy consumption data, the processing circuit 28 the adjusts the energy consumption data using the stored error rating data.

By using the stored data representative of the phase error ratings and the ratio error ratings of the external transformers 14, 15, 16, 17, 18 and 19 to adjust the energy consumption data, the energy consumption data will show improved accuracy over energy consumption data produced by meters that do not perform the adjustment discussed herein. Moreover, phase error ratings and ratio error ratings for external instrument transformers are readily available and indeed are typically affixed to the transformer housing via a metal plate or the like. Thus, introduction of the error rating data into the memory 30 may be readily accomplished, for example, through the input device 34.

Although adjustment of the calculated energy consumption data as discussed above improves the accuracy of the energy consumption data generated by the meter 10, it is preferable that the processing circuit 28 adjust the received digital energy consumption signals prior to generating energy consumption data. For example, in such a preferred embodiment, the processing circuit 28 adjusts digital voltage signal and/or digital current signal using the stored error rating data. In this manner, the adjusted digital voltage and current signals may be used for a variety of subsequent calculations without requiring adjustments for each such calculation.

Regardless of how the adjustment is made, the memory 30 may be any memory device such as random access memory, read only memory, or electrically erasable read only memory (EEPROM). It is preferable to employ an EEPROM as the memory 30 because it is both reprogrammable and non-volatile. The memory 30 may also be employed to store other relevant data within the meter. Stated another way, the memory 30 used in connection with the present invention may readily be a part of memory used for other purposes within the meter 10.

To achieve the above stated functions, the processing circuit 28 may suitably comprise a microprocessor, digital signal processor, collection of discrete digital components, or any combination of one or more of the above elements. As discussed above, the processing circuit 28 as described above operates in part as a portion of the compensation apparatus 12 according to the present invention and also in part as the measurement circuit that converts digital energy consumption signals into energy consumption data. It will be appreciated that in the alternative, separate processing circuits may be used for such purposes.

In the exemplary embodiment described herein, the processing circuit 28 preferably includes a digital signal processor and a microcontroller or the like. Suitable processing circuits that employ a digital signal processor and one or more microcontrollers or microprocessors are shown in U.S. Pat. No. 5,544,089 and U.S. Pat. No. 6,112,158, for example. Preferably, the functions associated with the compensation apparatus 12 of the processing circuit 28 are carried out primarily by the digital signal processor.

In operation, the meter 10 is provided to the vicinity of the load 36 for installation. At some point, an installation technician must obtain the ratio error ratings and the phase error ratings for the external transformers 14, 15, 16, 17, 18 and 19. To this end, the ratio error ratings and the phase error ratings are typically provided via indicia that is affixed to the transformer housing, not shown. For example, the ratio error rating and phase error rating of an instrument transformer are typically printed on a metal or plastic plate attached to the transformer housing. However, in some embodiments, data sheets or more substantial error data for the transformers may be provided.

The installation technician must then store data representative of the ratio error ratings and the phase error ratings in the memory 30 within the meter 10. To this end, the installation technician may provide the information through the input device 34. To do so, the meter 10 may need to be installed within the meter socket, not shown, so that it is connected to receive operating power from one or more of the power lines 20, 22, and 24. In such a case, the input device 34 may suitably be a communication port that enables communication via optical or electrical signals to a portable computer or meter programming device.

However, it will be noted that the data may be stored in the memory in other ways. For example, if the memory 30 is an EEPROM, the memory 30 may be removed and then connected to an external device, not shown, that writes the error rating data to the memory 30. The memory 30 may then be replaced into the meter 10. Such an operation may be performed without first installing the meter 10.

In any event, the installation technician must at some point install the meter 10 such that it is connected to the transformers 14, 15, 16, 17, 18 and 19 and to the neutral line 38. Meter installation procedures are well known to those of ordinary skill in the art.

After installation, the installation technician may cause the meter 10 to begin metering operations. During normal metering operations, the transformers 14, 16, and 18 receive the line signals $LS_A$, $LS_B$, and $LS_C$ respectively. The line signals $LS_A$, $LS_B$, and $LS_C$ constitute that actual electrical power signals that are provided to the load 36. The tranformers 14, 16, and 18 convert the lines signals $LS_A$, $LS_B$, and $LS_C$ to reduced power line current signals $RILS_A$, $RILS_B$, and $RILS_C$, and provide the reduced line current signals to the source of digital energy consumption signals 26. The tranformers 15, 17, and 19 convert the lines signals $LS_A$, $LS_B$, and $LS_C$ to reduced power line voltage signals $RVLS_A$, $RVLS_B$, and $RVLS_C$, and provide the reduced line voltage signals to the source of digital energy consumption signals 26.

The source of digital energy consumption signals receives the $RILS_A$, $RILS_B$, $RILS_C$, $RVLS_A$, $RVLS_B$, and $RVLS_C$ signals and generates digital energy consumption signals therefrom. In the exemplary embodiment described herein, the digital energy consumption signals include $VS_A$, $VS_B$, $VS_C$, $IS_A$, $IS_B$, and $IS_C$, where $VS_x$ is a digital voltage signal representative of the voltage waveform on the phase x power line, and $IS_x$ is a digital current signal representative of the current waveform on the phase x power line.

The processing circuit 28 receives the digital energy consumption signals and converts the digital energy consumption signals into energy consumption data. By way of example, the processing circuit 28 generates performs a real energy calculation by multiplying contemporaneous voltage and current samples of each phase together and then summing the resulting products over time. For example, in the exemplary four wire wye system shown in FIG. 1, the processing circuit 28 may perform the following calculations:

$$WH_A = VS_A(n) * IS_A(n) \text{ for } n=1 \text{ to } N$$

$$WH_B = VS_B(n) * IS_B(n) \text{ for } n=1 \text{ to } N$$

$$WH_C = VS_C(n) * IS_C(n) \text{ for } n=1 \text{ to } N$$

Total Energy=$WH_A + WH_B + WH_C$

Where $VS_x(n)$ is the nth voltage sample from phase x and $IS_x(n)$ is the nth voltage sample from phase x. The nth voltage sample and the nth current sample are sampled substantially contemporaneously.

In accordance with the present invention, however, the processing circuit 28 further performs an adjustment based on at least some of the stored data that is representative of the ratio error ratings or the phase error ratings of each of the transformers 14, 15, 16, 17, 18 and 19. To this end, the processing circuit 28 obtains the stored error rating data from the memory 30. As discussed above, the actual adjustment may be made to either the values $WH_x$ or Total Energy. Thus, the processing circuit 28 could perform the following adjustment:

$$Adj\_WH_A = f\{WH_A(n), ra\_err\_IA, ph\_err\_IA, ra\_err\_VA, ph\_err\_VA\}$$

$$Adj\_WH_B = f\{WH_B(n), ra\_err\_IB, ph\_err\_IB, ra\_err\_VB, ph\_err\_VB\}$$

$$Adj\_WH_C = f\{WH_C(n), ra\_err\_IC, ph\_err\_IC, ra\_err\_VC, ph\_err\_VC\}$$

Total Energy=$Adj\_WH_A + Adj\_WH_B + Adj\_WH_C$

Where ra_err_Ix is data representative of the ratio error rating of the CT connected to the phase x power line, ph_err_Ix is data representative of the phase error rating of the CT connected to the phase x power line, ra_err_Vx is data representative of the ratio error rating of the PT connected to the phase x power line, ph_err_Vx is data representative of the phase error rating of the PT connected to the phase x power line. Those of ordinary skill in the art may readily define a function f that increases the accuracy of the calculated real energy based on either the ratio error or the phase error.

By way of example, the value $WH_x$ may simply be multiplied by a compensation factor that is based on the ratio error of the current transformer connected to phase x. In such a case, the values ra_err_Vx, ph_err_Ix and ph_err_Vx are disregarded. However, those of ordinary skill in the art may readily incorporate any or all of the other error ratings into the energy consumption calculation if greater accuracy is desired. It will be noted that in accordance with the present invention, the use of only some of the error ratings in the compensation function will provide at least some improved accuracy.

In any event, in contrast to the above described compensation function, in the preferred embodiment described herein, the processing circuit 28 performs the adjustment on the voltage and/or current samples prior performing the real energy calculation or any other energy consumption calculations. Accordingly, instead of performing the above described functions, the processing circuit 28 receives the digital energy consumption signals $VS_A$, $VS_B$, $VS_C$, $IS_A$, $IS_B$, and $IS_C$, and performs the adjustment on those signals.

In particular, the processing circuit first performs the following operations to adjust the current sample values of the digital current signal:

$$Adj\_IS_A(n) = f(IS_A(n), ra\_err\_IA, ph\_err\_IA)$$

$$Adj\_IS_B(n) = f(IS_B(n), ra\_err\_IB, ph\_err\_IB)$$

$$Adj\_IS_C(n) = f(IS_C(n), ra\_err\_IC, ph\_err\_IC)$$

Similar functions may be performed on the voltage samples to produce $Adj\_VS_A(n)$, $Adj\_VS_B(n)$, and $Adj\_VS_C(n)$. Exemplary functions for generating the adjusted samples are discussed below in connection with FIGS. 3 and 4.

With reference to the preferred embodiment described herein, the processing circuit 28 generates the energy consumption data using the adjusted digital energy consumption signals. For example, the processing circuit 28 would perform the real energy calculation discussed above using the following equations:

$$WH_A = \Sigma Adj\_VS_A(n) * Adj\_IS_A(n) \text{ for } n=1 \text{ to } N$$

$$WH_B = \Sigma Adj\_VS_B(n) * Adj\_IS_B(n) \text{ for } n=1 \text{ to } N$$

$$WH_C = \Sigma Adj\_VS_C(n) * Adj\_IS_C(n) \text{ for } n=1 \text{ to } N$$

Total Energy=$WH_A + WH_B + WH_C$

One advantage of adjusting the digital energy consumption signals prior to generating energy consumption data is that no further adjustment is required to perform other energy consumption data calculations. Thus, for example, the per phase RMS voltage, per phase RMS current, reactive energy, apparent energy, power factor or other energy consumption data may readily be calculated using the adjusted voltage and current samples.

Figure 3:
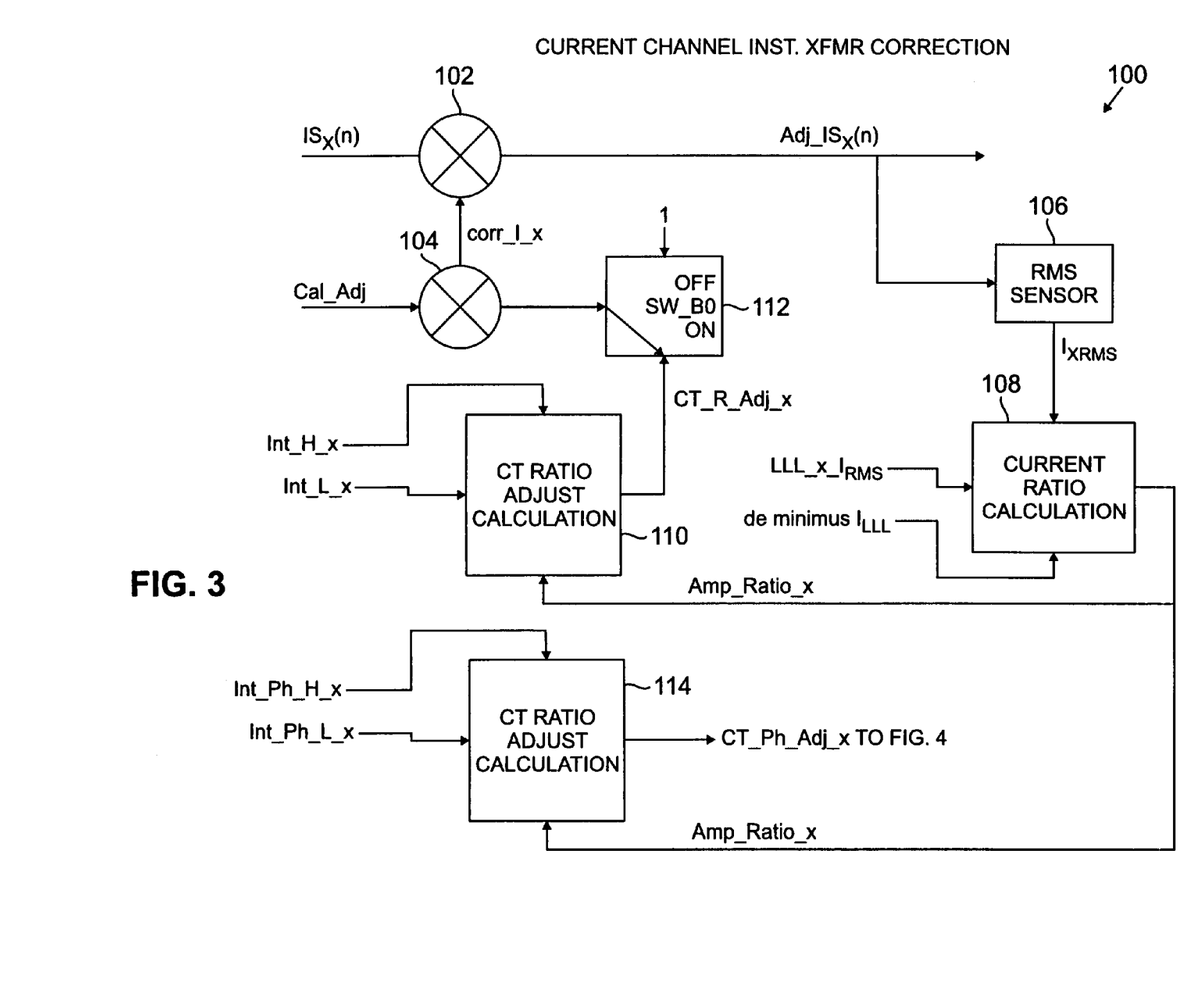
FIG. 3 shows a block diagram of operations performed on current sample values in an exemplary compensation apparatus according to the present invention.
Figure 4:
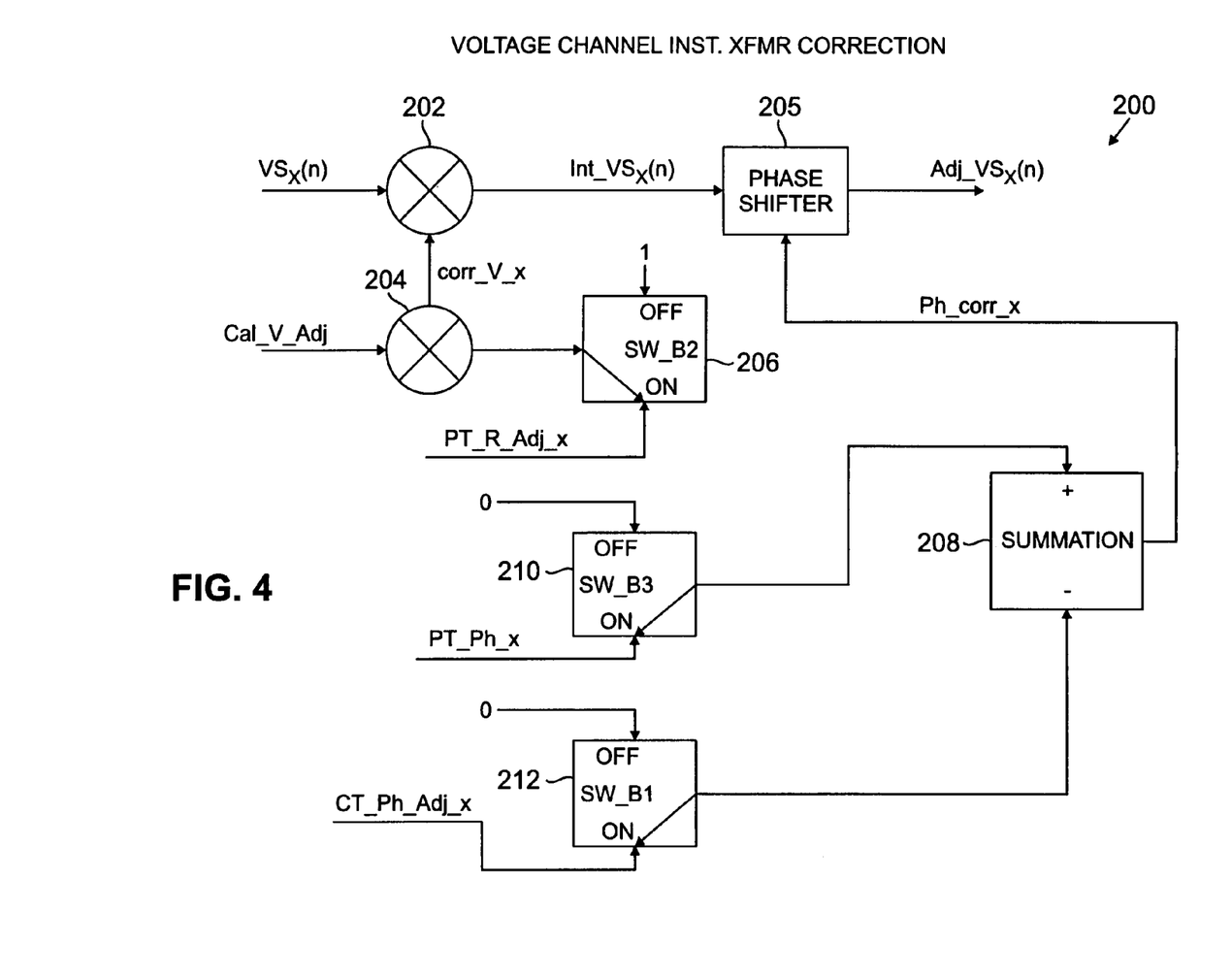
FIG. 4 shows a block diagram of operations performed on voltage sample values in an exemplary compensation apparatus according to the present invention.

FIGS. 3 and 4 shows in further detail exemplary block diagrams of the processing circuit operations for use in the compensation apparatus 12 of FIG. 1 in accordance with the present invention. Those of ordinary skill in the art may readily incorporate the operations shown in the block diagrams of FIGS. 3 and 4 into a digital signal processor of the processing circuit 28 of FIG. 1. However, it will be noted that the operations of FIGS. 3 and 4 may be carried out by processing circuits in meters that are not also used to generate energy consumption data. In such cases, the outputs of FIGS. 3 and 4 would be provided to the processing circuit that generates the energy consumption data.

Referring again to the exemplary embodiment described herein, the block diagram 100 of FIG. 3 shows the operations performed by the processing circuit 28 according to the present invention to adjust the current sample values $IS_x(n)$ of phase x of a digital energy consumption signal. While the example is shown in relation to a single phase x, it will be noted that the block diagram 100 may readily be expanded to perform the operations on the current samples of three phases.

In general, the processing circuit 28 performs the operations of the block diagram 100 to convert the raw sample values $IS_x(n)$ into adjusted current sample values $Adj\_IS_x(n)$ using data representative of the ratio error rating of the external transformer on the phase x power line. The processing circuit 28 further adjusts the current sample values $IS_x(n)$ using internal calibration information. The internal calibration information comprises a calibration factor that compensates for various error sources within the meter, for example, phase or magnitude errors caused by the sensor devices within the source of digital electricity consumption signals 26. Because the input current sample values $IS_x(n)$ are adjusted for both externally and internally generated errors, the value $Adj\_IS_x(n)$ more accurately reflects the current waveform on the relevant power line for the purposes of energy consumption calculations.

To this end, the current sample values $IS_x(n)$ are provided to a correction multiplier 102. The correction multiplier 102 also receives a phase x current correction factor corr_I_x from a correction pre-multiplier 104. The correction multiplier 102 multiplies each voltage sample value $IS_x(n)$ by corr_I_x to generate the output value $Adj\_IS_x(n)$. The value corr_I_x represents the combined calibration factors generated from the internal calibration information Cal_Adj and the external transformer ratio error compensation of the present invention, CT_R_Adj_x.

The internal calibration information may be generated as is known in the art. For example, the internal calibration information may be generated using data from a calibration operation in which a known amount of energy is provided to the meter 10 in the factory or otherwise. In the calibration operation, the amount of energy consumption actually measured by the meter 10 is compared to the known amount of energy provided to the meter 10 to determine the internal calibration factor. Such operations are well known in the art. It will be appreciated, however, that if high quality, low tolerance sensor circuitry is employed, there may be no need for correction using internal calibration information. In such a case, the compensation pre-multiplier 104 would not be necessary and the compensation multiplier 102 would be connected directly to receive the external CT ratio error compensation value CT_R_Adj_x.

In either event, the ratio error compensation value CT_R_Adj_x is derived from the ratio error ratings for current of the transformer on phase x. In particular, as discussed above, transformer errors are often specified in terms of, among other things, ratio error ratings. For example, a current ratio error rating may identify the difference between the current magnitude actually produced by the second winding of the transformer and the expected current magnitude. The current ratio error rating is typically given as a factor in relation to the average current level. Thus, multiplication of the measured RMS current by the ratio error rating would produce the actual current level. Because external transformers are relatively accurate, it is not uncommon for a ratio error rating to be in the range of 0.995 to 1.005.

Thus, if the ratio error rating for the relevant transformer is given as a single or average number, for example, 1.0003, then the error compensation value CT_R Adj_x may suitably be 1.0003. As a result, the processing circuit 28 would generate the output current sample values, $Adj\_IS_x(n)$ using the following equation:

$$Adj\_IS_x(n) = CT\_R\_Adj\_x * Cal\_Adj * IS_x(n)$$

where Cal_Adj is the internal calibration information and $$CT\_R\_Adj\_x = K1,$$

where K1 is a constant based on the ratio error rating, which in the above example would simply be a normalized value of 1.0003. Normalization is typically required to translate the specific ratio error rating into the value range used by the specific processing system. By way of example, the processing circuit 28 may employ integer arithmetic and thus require translation into numbers suitable for use in integer arithmetic.

It will be appreciated, however, that the ratio error of a current transformer is seldom a constant value. Instead, the ratio error typically varies as a function of load current. Accordingly, ratio error ratings for external current transformers are often published to include at least one "low load level" rating and at least one "high load level" rating. "Low load" is known in the industry to be current levels that are approximately 10% of the "high load". High load, by contrast, is a known function of the overall current capacity of the transformer. Such relationships are known in the art.

Because the ratio error is typically not constant, it is desirable to use a dynamic compensation factor that changes as a function of the load level or average current level. Using the high load ratio error rating and the low load ratio error rating, the compensation factor CT_R_Adj_x may be formulated as a function of RMS current (or average current). Such an expression would be:

$$CT\_R\_Adj\_x = f[HLL\_x\_R, LLL\_x\_R, Ix_{RMS}],$$

where HLL_x_R is the high load ratio error rating and LLL_x_R is the low load ratio error rating for the relevant CT on the power line x. The function f could, for example, be a linear function itself with a slope defined by the difference between the high load level ratio error rating and the low load level ratio error rating. In other words, the compensation factor could be expressed as $$CT\_R\_Adj\_x = KI + KS * Ix_{RMS}$$

where KS is derived from $$KS = A * [(HLL\_x\_R - LLL\_x\_R) / (HLL\_x\_I_{RMS} - LLL\_x\_I_{RMS})]$$

where, $HLL\_x\_I_{RMS}$ is the high load level RMS current, $LLL\_x\_I_{RMS}$ is the low load level RMS current, and A is a system-specific normalization factor. KI is a y-intercept value which may readily be derived by those of ordinary skill in the art by plotting the high load level and low load level error ratings against the high and low load level RMS currents.

It is noted that, as discussed above, the values HLL_x_R, LLL_x_R, $HLL\_x\_I_{RMS}$, and $LLL\_x\_I_{RMS}$ are all typically available directly through labeling on the transformer itself. Accordingly, the actual values $LLL\_x\_I_{RMS}$, $HLL\_x\_I_{RMS}$, LLL_x_R, and HLL_x_R may be stored in the memory 30 by the technician during meter installation as discussed above.

Figure 5:
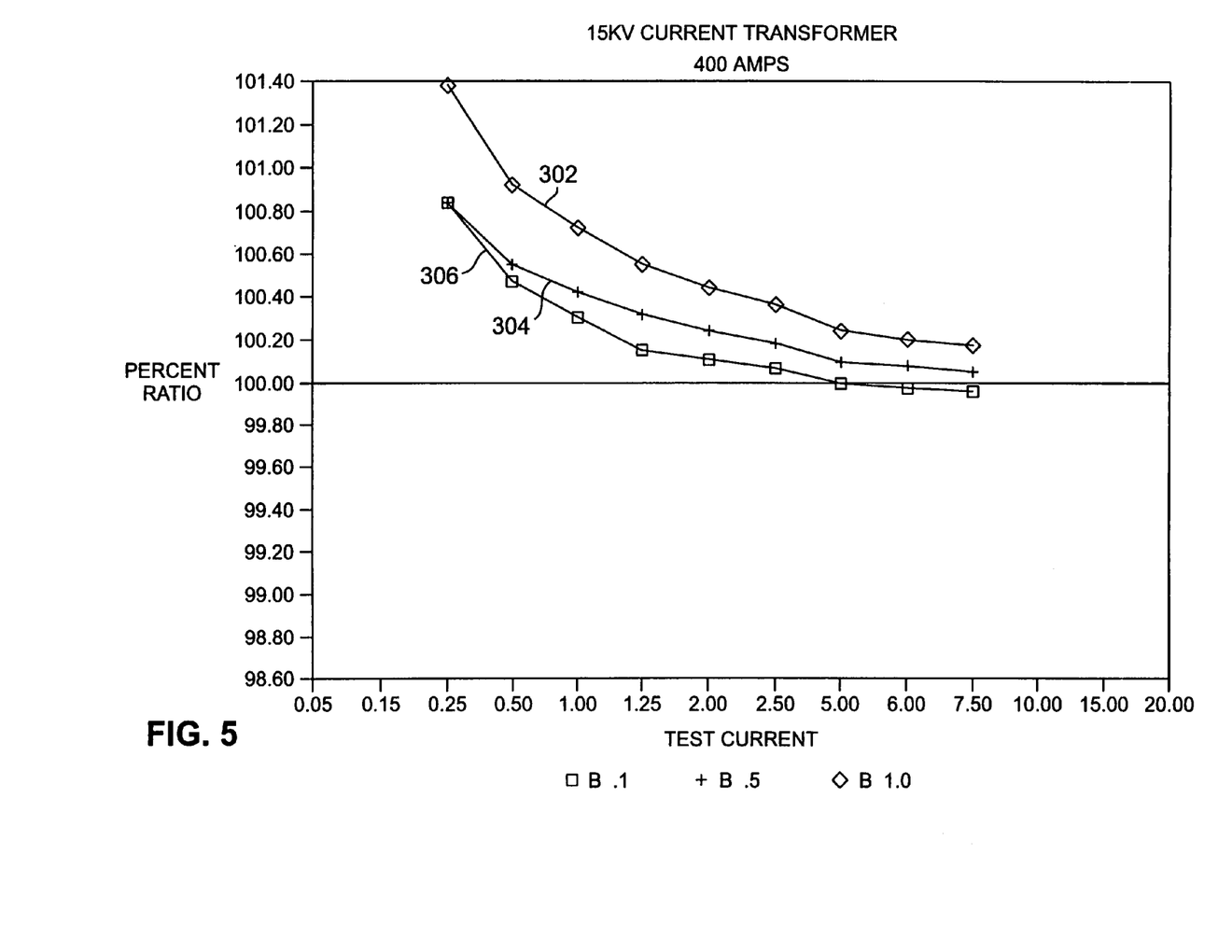
FIG. 5 shows error versus load current curves for an exemplary transformer.

In addition, it has further been observed that the variance of the actual ratio error, determined empirically, does not vary in a strictly linear relationship with respect to average load current. FIG. 5 shows exemplary test results showing the ratio error as a function of RMS load current level. The test results of FIG. 5 shows a first curve 302 of the actual measured ratio error percentage as a function of input current on an exemplary transformer wherein the input power signal had a power factor of 1.0. Similar response curves 304 and 306 were observed at other power factors.

Using approximate curve fitting, it is observable that the error ratio rating of the transformers varies in an inverse relationship to current, or in other words, as a factor of (RMS current)$^{-P}$, where P is a positive number, for example, 1.

Accordingly, in accordance with a preferred embodiment of the present invention, the compensation factor CT_R_Adj_x is a function that varies in an inverse relationship to the average or RMS current level. In the embodiment shown in FIG. 3, the inverse relationship is generated basically as the following equation.

$$CT\_R\_Adj\_x = KA_x + (KB_x / Ix_{RMS})$$

Where $KA_x$ and $KB_x$ are constants derived from the high and low load level error ratings for the transformer coupled to phase x.

Referring again to FIG. 3, the above general equation is carried out in the following manner. An RMS sensor 106 generates the $Ix_{RMS}$ information. To this end, the RMS sensor 106 receives the adjusted current sample values $IS_x(n)$ and performs a typical RMS calculation to generate $Ix_{RMS}$. A current ratio calculation block 108 receives the calculated $Ix_{RMS}$ and uses the value to generate an interim current ratio value Amps_Ratio_x that is generated from the equation $$Amps\_Ratio\_x = LLL\_x\_I_{RMS} / Ix_{RMS}$$

If, however, $Ix_{RMS}$ is zero, then $Ix_{RMS}$ is replaced by a de minimus value to avoid a divide by zero error. To carry out the foregoing Amps_Ratio_x determination, the current ratio calculation block 108 also receives, in addition to $Ix_{RMS}$, the low load RMS current level for the transformer, LLL_x_$I_{RMS}$, and the given de minimus current level. It can be seen from the above equation that the interim value Amps_Ratio_x carries the inverted RMS current or (RMS Current)$^{-1}$ information.

The current ratio calculation block 108 provides the calculated interim value Amps_Ratio_x to the ratio adjustment calculation block 110. The ratio adjustment calculation block 110 uses the Amps_Ratio_x value and two other interim values, one including primarily information derived from the high load ratio error rating for the transformer connected to phase x and the other including primarily information derived from the low load ratio error rating of the transformer connected to phase x. In particular, the interim values are Int_H_x and Int_L_x. Those values are generate as follows:

$$Int\_H\_x = \frac{[HLL\_x\_R - (LLL\_x\_I_{RMS}/HILL\_x\_I_{RMS}) * LLL\_x\_R]}{(1 - (LLL\_x\_I_{RMS}/HLL\_x\_I_{RMS}))}$$

$$Int\_L\_x = LLL\_x\_R$$

As discussed above, HLL_x_R is the high load ratio error rating for the transformer on phase x, LLL_x_R is the low load ratio error rating for the transformer on phase x, LLL_x_$I_{RMS}$ is the low load RMS current for the transformer, and HLL_x_$I_{RMS}$ is the high load RMS current for the transformer.

It will be noted that the actual values LLL_x_$I_{RMS}$, HLL_X_$I_{RMS}$, LLL_x_R, and HLL_x_R may be retrieved from the memory 30. However, in the alternative, the processing circuit 28 may convert those values directly into Int_H_x and Int_L_x before storing the data into the memory 30.

In any event, the ratio adjustment calculation block 110 performs the following calculation to produce the compensation factor CT_R_Adj_x:

$$CT\_R\_Adj\_x = Int\_H\_x + [Amps\_Ratio\_x * (Int\_L\_x - Int\_H\_x)]$$

Which from the above expands to show the inverse relationship to $Ix_{RMS}$:

$$CT\_R\_Adj\_x = Int\_H\_x + \frac{[LLL\_x\_I_{RMS} * (Int\_L\_x - Int\_H\_x)]}{Ix_{RMS}}$$

The ratio adjustment calculation block 10 provides the compensation factor CT_R_Adj_x to the compensation pre-multiplier 104 through a switch 112. The switch 112 may be used to disable the compensation if desired. It is preferable that the meter user have the option to disable the compensation when necessary. For example, disabling the compensation may be necessary to perform an in service certification of the meter's accuracy.

The block diagram 100 furthermore shows a phase adjustment calculation block 114 that generates a phase compensation factor based in part on the phase error ratings for the transformer x. As will be discussed further below, the phase compensation factor CT_Ph_Adj_x is applied to adjust the voltage sample values $VS_x(n)$ in the exemplary embodiment herein. It will be noted that a phase adjustment may be applied to either the current sample values or the voltage sample values, because it is the phase difference between the current waveform and the voltage waveform that requires accuracy. In the exemplary embodiment herein, the phase compensation factor is applied to the voltage sample values $VS_x(n)$ as discussed further below in connection with FIG. 4. However, the exemplary embodiment described herein may readily be modified to apply the phase compensation factor to the current sample values $IS_x(n)$.

Application of the phase adjustment to the voltage samples is preferable because the adjustment is less subject to rounding errors. In particular, because current signals vary greatly and may become relatively small, a relatively small phase adjustment may be prone to rounding errors. By contrast voltage signals are constant and relatively large.

In any event, the calculation of the phase compensation factor, CT_Ph_Adj_x, like the ratio compensation factor, CT_R_Adj_x, may be expressed as a constant based on the phase error rating for the transformer on the phase x power line. As with the ratio error ratings discussed above, however, it is typical to provide two phase error ratings, one at high load currents and one at low load currents. Accordingly, similar to CT_R_Adj_x, the value CT_Ph_Adj_x is preferably dynamic and is a function of the load current, or $Ix_{RMS}$. Thus, for example, the phase compensation factor may be given by the following equation:

$$CT\_R\_Adj\_x = KI\_Ph\_x + KS\_Ph\_x * Ix_{RMS}$$

where KS_Ph_x is derived from $$KS\_Ph\_x = B * [(HLL\_x\_Ph - LLL\_x\_Ph) / (HLL\_x\_I_{RMS} - LLL\_x\_I_{RMS})]$$

where, HLL_x_Ph is the high load phase error rating, LLL_x_Ph is the low load level phase error rating, and B is a system-specific normalization factor. KI_Ph_x is a y-intercept value which may readily be derived by those of ordinary skill in the art.

However, similar to the ratio error ratings on external instrument transformers, it has been noted that the relationship between the actual phase error factor with respect to current level is not strictly linear. It has been observed that the phase error of transformers will vary in an inverse relationship to average or RMS current, or in other words, as a factor of (RMS current)$^{-P}$, where P is a positive number, for example, 1.

Accordingly, in accordance with a preferred embodiment of the present invention, the compensation factor CT_Ph_Adj_x is a function that varies in an inverse relationship to the average or RMS current level. In the embodiment shown in FIG. 3, the inverse relationship is generated basically as the following equation.

$$CT\_Ph\_Adj\_x = KC_x + (KD_x / Ix_{RMS})$$

where $KC_x$ and $KD_x$ are constants derived from the high and low load level phase error ratings for the transformer coupled to phase x.

The above-described generalized equation is carried out by the phase adjustment calculation block 114 in the following manner. The phase adjustment calculation block 114 uses the Amps_Ratio_x value and two other interim values, one including primarily information derived from the high load phase error rating for the transformer connected to phase x, HLL_x_Ph, and the other including primarily information derived from the low load ratio error rating of the transformer connected to phase x, LLL_x_Ph. In particular, the interim values are Int_Ph_H_x and Int_PH_L_x. Those values are generated as follows:

$$Int\_Ph\_H\_x = \frac{[HLL\_x\_Ph - (LLL\_x\_I_{RMS} / HLL\_x\_I_{RMS}) * LLL\_x\_Ph]}{(1 - (LLL\_x\_I_{RMS} / HLL\_x\_I_{RMS}))}$$

$$Int\_Ph\_L\_x = LLL\_x\_Ph$$

As discussed above, HLL_x_Ph is the high load ratio error rating for the transformer on phase x, LLL_x_Ph is the low load ratio error rating for the transformer on phase x, $LLL\_x\_I_{RMS}$ is the low load RMS current for the transformer, and $HLL\_X\_I_{RMS}$ is the high load RMS current for the transformer. All those values are typically available for a given instrument transformer.

As with the ratio error information, the values $LLL\_x\_I_{RMS}$, $HLL\_x\_I_{RMS}$, LLL_x_Ph, and HLL_x_Ph, which may be normalized for the processing unit 28, may be retrieved from the memory 30. However, in the alternative, the processing circuit 28 may convert those values directly into Int_Ph_H_x and Int_Ph_L_x before storing the data into the memory 30.

In any event, the phase adjustment calculation block 114 performs the following calculation to produce the compensation factor CT_Ph_Adj_x:

$$CT\_Ph\_Adj\_x = Int\_Ph\_H\_x + [Amps\_Ratio\_x * (Int\_Ph\_L\_x - Int\_Ph\_H\_x)]$$

Which from the above expands to show the inverse relationship to $Ix_{RMS}$:

$$CT\_Ph\_Adj\_x = Int\_Ph\_H\_x + \frac{[LLL\_x\_I_{RMS} * (Int\_Ph\_L\_x - Int\_Ph\_H\_x)]}{Ix_{RMS}}$$

The phase adjustment calculation block 114 provides the compensation factor CT_Ph_Adj_x to the phase adjust summation device 208 in FIG. 4 through a switch 212.

Referring to FIG. 4, the block diagram 200 of FIG. 4 shows the general operations of the processing circuit 28 that are executed to adjust voltage sample values $VS_x(n)$ received from the source of digital electrical consumption signals 26. In general, the processing circuit 28 performs the operations of the block diagram 200 to convert the raw voltage sample values $VS_x(n)$ into adjusted voltage sample values $Adj\_VS_x(n)$ using data representative of the various error ratings of the external potential transformers on the phase x power line. Moreover, as discussed above, the processing circuit 28 also uses the determined current transformer phase compensation factor CT_Ph_Adj_x to generate the adjusted voltage sample values to compensate for the external current transformer phase error.

The processing circuit 28 further adjusts the voltage sample values $VS_x(n)$ using internal calibration information. As discussed above, internal calibration information comprises a calibration factor that compensates for various error sources within the meter, for example, phase or magnitude errors in the sensor devices within the source of digital electricity consumption signals 26. Thus, the value $Adj\_VS_x(n)$ more accurately reflects the voltage waveform on the relevant power line for the purposes of energy consumption calculations.

In particular, the voltage sample values $VS_x(n)$ are provided to a correction multiplier 202. The correction multiplier 202 also receives a phase x voltage correction factor corr_V_x from a correction pre-multiplier 204. The correction multiplier 202 multiplies each voltage sample value $VS_x(n)$ by corr_V_x to generate an interim value, $Int\_VS_x(n)$, which is in turn provided to a phase shifter 205 to generate the output value $Adj\_VS_x(n)$. The value corr_V_x represents the combined calibration factors of the internal calibration information, Cal_V_Adj, and the external potential transformer ratio error compensation.

The internal calibration information may be generated as is known in the art. As above, it will be appreciated that the use of high quality, low tolerance sensor circuitry may eliminate the need for correction using internal calibration information. In such a case, the compensation pre-multiplier 204 would not be necessary and the compensation multiplier 202 would be connected to receive directly the external potential transformer ratio error compensation value PT_R_Adj_x.

In either event, the ratio error compensation value PT_R_Adj_x is derived from the ratio error ratings for the potential transformer on phase x. In particular, as discussed above, transformer errors are often specified in terms of, among other things, ratio error ratings. For example, a potential ratio error rating may identify the difference between the voltage magnitude actually produced by the second winding of the transformer and the expected voltage magnitude. The voltage ratio error rating is typically given as a factor in relation to the average voltage level. Thus, multiplication of the measured RMS voltage by the ratio error rating would produce the actual voltage magnitude. Because external transformers are relatively accurate, it is not uncommon for a ratio error rating to be in the range of 0.995 to 1.005.

Thus, if the ratio error rating for the relevant transformer is given as a single or average number, for example, 1.0002, then the error compensation value PT_R_Adj_x may suitably be simple 1.0002. As a result, the processing circuit 28 would generate the output current sample values, Int__VS$_x$(n) using the following equation:

Int__VS$_x$(n)=PT__R__Adj__x*Cal__Adj__V*VS$_x$(n)

where Cal__Adj__V is the internal calibration information and

PT__R__Adj__x=K2, where K2 is a constant based on the ratio error rating, which in the above example would simply be a normalized value of 1.0002.

Unlike the current transformer ratio correction factor CT__R__Adj__x discussed above in connection with FIG. 3, the potential transformer ratio correction factor PT__R__Adj__x provides sufficient correction as a constant factor. In particular, as opposed to current in the power lines, the voltage in the power lines should remain substantially constant, as is known in the art. Accordingly, it is not necessary to vary the correction factor as a function of average line voltage.

It is noted that because the potential does not vary significantly in an instrument potential transformer, such transformers are typically provided with only one ratio error rating. That ratio error rating, after normalization, may be used directly as the potential transformer ratio correction factor PT__R__Adj__x.

The potential transformer ratio correction factor PT__R__Adj__x may be provided to the compensation premultiplier 204 through a switch 206 to allow the operator to disable the ratio compensation if desired.

The processing circuit 28 in the execution of the block diagram 200 further generates a potential transformer phase correction factor PT__Ph__Adj__x. As with the ratio error rating, the potential transformer phase correction factor PT__Ph__Adj__x may be a constant factor derived directly from the potential transformer phase error rating, PT__Ph__x. As with the current transformer phase error ratings, the potential transformer phase error rating, PT__Ph__x is typically provided in units of minutes, or sixtieths of a degree.

In any event, the potential transformer phase correction factor, PT__Ph__Adj__x is provided to the positive input of a summation device 208 through disabling switch 210. Likewise, the current transformer phase correction factor, CT__Ph__Adj__x, generated in the execution of the flow diagram 100 of FIG. 3, is provided to the negative input of the summation device 208 through a disabling switch 212.

The summation device 208 generates a composite phase correction value Ph__corr__x for the phase x voltage sample values, VS$_x$(n). The composite phase correction value Ph__corr__x is then provided to a phase shifter 205 which then adjusts the phase using Ph__corr__x.

Figure 6:
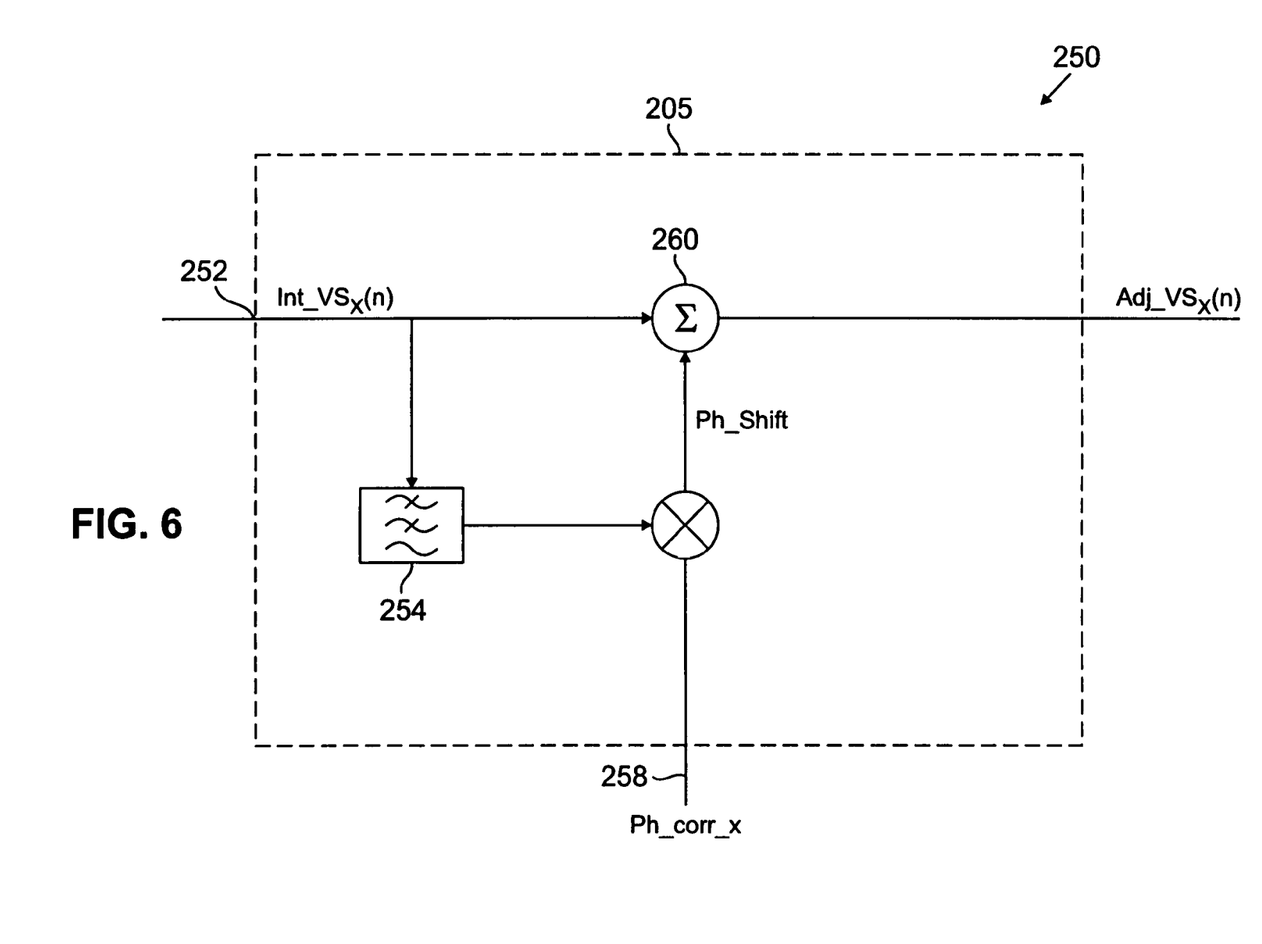
FIG. 6 shows an exemplary phase shifter that may be used in connection with the flow diagrams of FIGS. 4 and 5.

To this end, the phase shifter 205 may suitably take the form of the exemplary block diagram 250 on FIG. 6. In particular, the phase shifter 205 in FIG. 6 includes a voltage sample input 252, a low pass digital filter 254, a multiplier 256, a phase correction input 258, and a summation device 260.

The voltage sample input 252 receives the interim voltage sample values Int__VS$_x$(n) from the compensation multiplier 202 of FIG. 4 and provides the interim sample values to the low pass digital filter 254 and the summation device 260. The low pass digital filter 254 provides the phase-shifted and filtered voltage sample values to a first input of the multiplier 256. To this end, the low pass digital filter 254 may suitably be a single pole, IIR low pass filter having approximately a 1 Hz corner frequency (in a 60 Hz power system). As a result, the delayed samples are almost 90° out of phase.

The phase correction input 258 is coupled to provide the composite phase correction value Ph__corr__x to the second input of the multiplier 256. The multiplier 256 multiplies Ph__corr__x by the phase-shifted voltage sample values to generate a phase shift value, Ph__shift. The multiplier 256 provides the phase shift value Ph__shift to the summation device 260. The summation device 260 sums the interim voltage sample values provided by the voltage sample input 252 with Ph__shift to effectuate the phase shift of the interim voltage sample values. The phase shifted interim sample values constitute the final adjusted voltage sample values Adj__VS$_x$(n).

Thus, the present invention effectuates a compensation for both potential transformer error and current transformer error that are coupled external to the meter 10. As is known in the art, such external transformers typically provide error rating information. The present invention allows the use of that error rating to generate a compensation factors to increase the reliability of the generated meter data. It will be noted that at least some of the benefits of the present invention will be realized even if only one or two of the above described compensation factors is employed. For example, employing only the current transformer ratio compensation factor in accordance with the present invention will provide at least some reduction in metering error. Likewise, at least some effort of the invention is realized if the compensation is only based on the current transformer phase error rating, or either of the potential transformer error ratings. Moreover, it may be useful in retrofit or modification applications to employ the compensation method and apparatus described herein for certain errors while employing existing compensation arrangements to compensate for other errors.

In any event, it will be appreciated that the embodiments described herein are merely exemplary, and that those of ordinary skill in the are may readily devise their own implementations that incorporate the principles of the present invention and fall within the spirit and scope thereof.

I claim:

1. An arrangement for use in an electricity meter, the electricity meter operably coupled through an external transformer to measure electricity consumption on a power line, the arrangement operable to compensate for measurement errors, the arrangement comprising:
   a) a source of digital measurement signals comprising an internal sensor circuit and an analog-to-digital conversion circuit, the internal sensor circuit configured to convert power line signals received from the external transformer to measurement signals, the analog-to-digital conversion circuit configured to receive the measurement signals from the sensor circuit and convert the measurement signals to digital measurement signals;
   b) a memory storing data representative of at least one error rating for the external transformer;
   c) a processing circuit operably coupled to the source of digital measurement signals to receive digital measurement signals therefrom; the processing circuit operable to
   obtain at least one electricity consumption measurement value corresponding to at least a part of the digital measurement signals,
   adjust the at least one electricity consumption measurement value using at least a portion of the stored data, and adjust the at least one electricity consumption measurement value using an internal calibration value, the internal calibration value corresponding to at least one error associated with the internal sensor circuit.

2. The arrangement of claim 1 wherein the at least one electricity consumption measurement value comprises a calculated energy consumption value.

3. The arrangement of claim 1 wherein the at least one electricity consumption measurement value comprises at least one of a sampled current value or a sampled voltage value.

4. An apparatus for use in an electricity meter, the electricity meter operably coupled through an external transformer to measure electricity consumption on a power line; the apparatus operable to compensate for measurement errors of an external transformer, the apparatus comprising:
   a) a memory storing data representative of at least one error rating for the external transformer;
   b) a processing circuit operable to
   obtain at least one electricity consumption measurement value, the electricity consumption measurement value representative of a waveform sample, the waveform sample derived from a current waveform or a voltage waveform, and
   adjust at least one electricity consumption measurement value using at least a portion of the stored data.

5. The apparatus of claim 4 wherein the waveform sample is derived from a current waveform, and wherein the processing circuit is further operable to:
   obtain at least one error rating comprising a ratio error rating for the external transformer;
   adjust the at least one electricity consumption measurement value using the stored data representative of the ratio error rating.

6. The apparatus of claim 4 wherein the processing circuit is further operable to:
   obtain at least one error rating comprising a phase error rating for the external transformer; and
   adjust at least one electricity consumption measurement value using the stored data representative of the phase error.

7. The apparatus of claim 4 wherein the processing circuit is further operable to adjust the at least one electricity consumption measurement value by multiplying either the at least one electricity consumption measurement value or a phase shifted electricity compensation measurement value by a dynamic compensation factor.

8. The apparatus of claim 7 wherein the processing circuit is further operable to adjust the at least one electricity consumption measurement value by multiplying either the at least one electricity consumption measurement value or the phase shifted electricity consumption measurement value by the dynamic compensation factor, the dynamic compensation factor varying with respect to an average electricity consumption measurement value.

9. The apparatus of claim 8 wherein the dynamic compensation value varies in an inverse relationship with respect to the average electricity consumption measurement value.

10. The apparatus of claim 8 wherein the waveform sample is derived from a current waveform, and wherein the processing circuit is further operable to:
   multiply the at least one electricity consumption measurement value using a ratio correction factor that is a function of the stored data representative of a ratio error rating and an average current measurement value.

11. The apparatus of claim 8 wherein the processing circuit is further operable to:
   multiply the phase shifted electricity consumption measurement value using a phase correction factor that is a function of the stored data representative of the phase error rating and an average current measurement value to produce a phase shift value; adding the phase shift value to the at least one sampled current value.

12. The apparatus of claim 8 wherein the waveform sample is derived from a current waveform, and wherein the processing circuit is further operable to:
   adjust dynamically the at least one electricity consumption measurement value using a correction factor that has an inverse relationship to an average current measurement value.

13. The apparatus of claim 4 wherein the processing circuit includes a digital signal processor.

14. The apparatus of claim 4 wherein the memory includes an EEPROM.

15. The apparatus of claim 4 further comprising a source of digital measurement signals operably coupled to receive energy consumption signals from the external transformer, the source of digital measurement signals operable to generate a plurality of waveform samples including the waveform sample from the received energy consumption signals.

16. The apparatus of claim 15 wherein the source of digital measurement signals includes an analog-to-digital converter configured to generate the plurality of waveform samples including the waveform sample.

17. The apparatus of claim 16 further comprising an internal sensor circuit configured to convert energy consumption signals received from the external transformer to measurement signals, and wherein the analog-to-digital conversion circuit is configured to receive the measurement signals from the sensor circuit and convert the measurement signal to the plurality of waveform samples.

18. The apparatus of claim 17 wherein the processing circuit is further operable to adjust the at least one electricity consumption measurement value using an internal calibration value, the internal calibration value corresponding to at least one error associated with the internal sensor circuit.

19. An apparatus for use in an electricity meter, the electricity meter operably coupled through an external transformer to measure electricity consumption on a power line; the apparatus operable to compensate for measurement errors of an external transformer, the apparatus comprising:
   a) a memory storing data representative of at least one error rating for the external transformer;
   b) a processing circuit operable to
   obtain at least one electricity consumption measurement value, the at least one electricity consumption measurement value comprising either a sampled current value or a sampled voltage value, and
   adjust the at least one electricity consumption measurement value using at least a portion of the stored data,
   adjust the at least one electricity consumption measurement value by multiplying either the at least one electricity consumption measurement value or a phase shifted electricity compensation measurement value by a dynamic compensation factor, the dynamic compensation factor varying with respect to an average electricity consumption measurement value.

20. The apparatus of claim 19 wherein the dynamic compensation value varies in an inverse relationship with respect to the average electricity consumption measurement value.

21. The apparatus of claim 19 wherein the processing circuit is further operable to:
  obtain at least one sampled current value; and
  multiply the at least one sampled current value using a ratio correction factor that is a function of the stored data representative of a ratio error rating and an average current measurement value.

22. The apparatus of claim 19 wherein the processing circuit is further operable to:
  multiply the phase shifted electricity consumption measurement value using a phase correction factor that is a function of the stored data representative of the phase error rating and an average current measurement value to produce a phase shift value; adding the phase shift value to the at least one sampled current value.

23. The apparatus of claim 19 wherein the processing circuit is further operable to:
  obtain at least one sampled current value; and
  adjust dynamically the at least one sampled current value using a correction factor that has an inverse relationship to an average current measurement value.

* * * * *